United States Patent [19]
Kondo et al.

[11] Patent Number: 5,064,745
[45] Date of Patent: Nov. 12, 1991

[54] METHOD FOR MAKING LITHOGRAPHIC PRINTING PLATE

[75] Inventors: Toshiro Kondo; Hidetoshi Miura; Yasuo Tsubai, all of Nagaokakyo, Japan

[73] Assignee: Mitsubishi Paper Mills, Ltd., Tokyo, Japan

[21] Appl. No.: 313,042

[22] Filed: Feb. 21, 1989

[30] Foreign Application Priority Data

Feb. 25, 1988 [JP] Japan ................................ 63-43096

[51] Int. Cl.$^5$ ............................................. G03C 1/06
[52] U.S. Cl. .................................... 430/265; 430/204; 430/264; 430/267; 430/302; 430/309
[58] Field of Search ............... 430/309, 204, 302, 264, 430/265, 267

[56] References Cited

U.S. PATENT DOCUMENTS

| | | | |
|---|---|---|---|
| 3,099,209 | 7/1963 | Damschroder et al. | 101/149.2 |
| 3,186,842 | 6/1965 | De Haes et al. | 96/29 |
| 3,454,398 | 7/1969 | Wendt, Otto B. | 96/33 |
| 4,443,531 | 4/1984 | Yamada et al. | 430/309 |

OTHER PUBLICATIONS

Research Disclosure, No. 140, Dec. 1975, pp. 33-36, Havant, GB; J.D. BASS: "Lithographic Fixing Compositions".

Patent Abstracts of Japan, vol. 7, No. 241 (P0232) [1386], 26th Oct. 1983; JP-A-58 127 928, Mitsubishi Seishi K.K.) 30-07-1983.

*Primary Examiner*—Charles L. Bowers, Jr.
*Assistant Examiner*—J. Weddington
*Attorney, Agent, or Firm*—Cushman, Darby & Cushman

[57] ABSTRACT

The invention provides a process for making a lithographic printing plate utilizing silver image as ink receptive area which is markedly improved especially in printing endurance. The process comprises subjecting a light-sensitive material for lithographic printing plate to imagewise exposure and development and then treating the resulting silver image with an oxidizing agent and a monocyclic compound comprising a nitrogen-containing single ring and having substituents on at least two atoms constituting said ring, said substituents being capable of reacting with silver ion. The oxidizing agent and the monocyclic compound may be contained separately or together in a stop solution, a fixing solution, an etch solution or damping solution or especially prepared solution.

9 Claims, No Drawings

METHOD FOR MAKING LITHOGRAPHIC PRINTING PLATE

BACKGROUND OF THE INVENTION

The present invention relates to a process for making a lithographic printing plate having a silver image utilized as ink receptive areas and in particular to a process for making a lithographic printing plate which has no stains and is markedly enhanced in printing endurance of silver image.

There have already been printing plates in practical use which are made using silver halide emulsions having a high sensitivity and capable of being spectrally sensitized. Among them, offset printing plates where silver images are utilized as ink receptive areas are disclosed in U.S. Pat. Nos. 3,721,559, 3,490,905, 3,385,701, 3,814,603, 3,454,398, 3,764,323 and 3,099,209, Japanese Patent Kokoku Nos. 48-30562 and 44-27242 and Japanese Patent Kokai Nos. 53-21602 and 53-9603.

These may be roughly classified to some types of printing plates, but they are common in utilization of silver as ink-receptive areas.

A lithographic printing plate consists of greasy ink receptive oleophilic image portions and ink repellent hydrophilic non-image portions, the latter being generally water receptive hydrophilic areas.

Accordingly, the ordinary lithographic printing is carried out by feeding both water and colored ink to the printing plate surface to allow the image portions to receive preferentially the colored ink and the non-image portions to receive preferentially water and then transferring the ink on the image portions onto a substrate such as paper.

In order to obtain a print of good quality, it is necessary that oleophilicity of the image portions and hydrophilicity of the non-image portions are both strong enough so that when water and ink are applied the image portions may receive sufficient amount of ink while the non-image portions may completely repel the ink and it is desired that this effect can be retained for printing of as many as possible copies.

The process for making printing plate using silver halide emulsion mentioned above is simple and reliable and can be performed at high speed and can be automated and besides the resulting printing plate has a high sensitivity, a high resolution and a high image reproducibility. However, the process suffers from the problem that the resulting printing plates cannot stand printing of a larger number of copies, namely, inferior in printing endurance as compared with other printing plates, for example, PS plates put in practical use which consists essentially of a bichromate sensitized hydrophilic colloid and a diazo sensitized organic colloid.

Many attempts have been made for improving these defects. One of them is use of an oxidizing agent to silver image. For example, Japanese Patent Kokai No. 55-98753 discloses use of an oxidizing agent and a compound having in a molecule a mercapto group or a thion group and a hydrophilic group. Further, Japanese Patent Kokai Nos. 51 58952 and 61-223740 disclose use of an oxidizing agent and an iodide (for example, sodium iodide). However, although these methods can enhance printing endurance of silver image, the enhancement is still insufficient as compared with PS plate and besides, ink receptivity is sometimes deteriorated.

As a result of the inventors' intensive research in an attempt to improve printing endurance by utilizing an oxidizing agent for silver image, it has been found that printing endurance markedly superior to that attained by the above-mentioned conventional methods can be obtained by using a certain kind of compound.

SUMMARY OF THE INVENTION

The object of the present invention is to provide a process for making a lithographic printing plate where silver image is utilized as ink receptive areas and which is superior in ink receptivity, is free from stains and is remarkably improved in printing endurance.

DESCRIPTION OF THE INVENTION

The above object of the present invention has been attained by a process for making a lithographic printing plate, characterized in that a light-sensitive material for lithographic printing plate where silver image is used as ink receptive area is subjected to imagewise exposure and developing treatment and the resulting silver image is treated with an oxidizing agent to silver and a compound which comprises a nitrogen-containing single ring which has substituents capable of reacting with silver ion on at least two atoms constituting the single ring.

The compound used in the present invention which has at least two groups reactive with silver ion is a 5- or 6-membered monocyclic compound which comprises at least one nitrogen atom and at least two carbon atoms and, if necessary, S, Se and O atoms. The monocyclic compound here should be distinguished from compounds having a condensed ring such as that of benzene ring and heterocyclic compounds having two or more heterocyclic rings in a molecule. Examples of the compound used in the present invention are as follows:

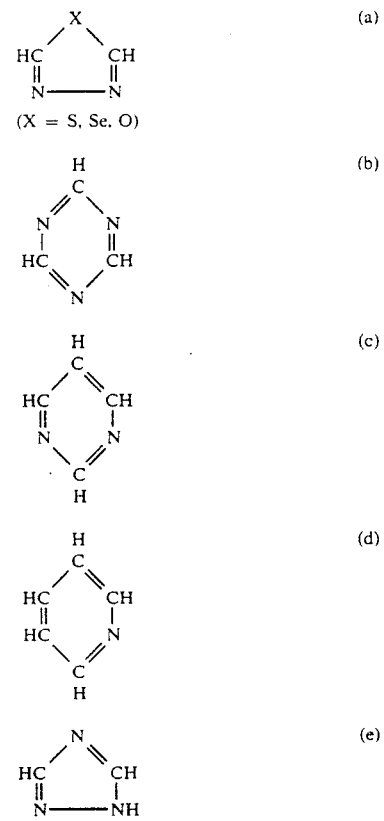

The compounds used in the present invention have on atoms constituting the single ring as mentioned above, preferably carbon atoms at least two substituents which can react with silver ion, for example, mercapto group (—SH), thion group (=S), thio group

R' is alkyl group, amino group, etc.), and thioalkyl group (—R"—SH; R" is alkyl group). Preferred substituent is mercapto group. Moreover, the other atoms which constitute the single ring may have substituents such as alkyl group, alkoxy group, amino group, substituted amino group, aryl group, aryloxy group, aralkyloxy group and halogen atom.

Preferably the total molecular weight of the substituents reactive with silver ion and the other substituents is 150 or less. It is considered that this is because such compounds penetrate into deeper portion of oleophilic silver image layer formed on a surface layer to increase mechanical strength of the silver image layer.

Especially preferred examples of the monocyclic compounds used in the present invention are selected from compounds represented by the following formula (I):

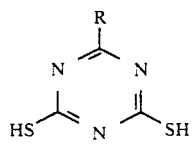

wherein R represents a hydrogen atom, an alkyl group

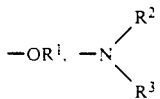

or a mercapto group wherein $R^1$, $R^2$ and $R^3$ each represents a hydrogen atom, an alkyl group, an aryl group; an aralkyl group or an alkenyl group.

Typical examples of the compounds represented by the formula (I) are shown in the following table.

| Compound No. | R in formula (I) |
| --- | --- |
| 1 | —H |
| 2 | —CH₃ |
| 3 | —C₄H₉ |
| 4 | —C₆H₅ |
| 5 | —OC₂H₅ |
| 6 | —SH |
| 7 | —NH₂ |
| 8 | —NHC₄H₉ |
| 9 | —N(C₂H₅)₂ |
| 10 | —N(C₄H₉)₂ |
| 11 | —NHC₆H₅ |
| 12 | —N(CH₂CH=CH₂)₂ |
| 13 |  |

The following compounds may also be preferably used.

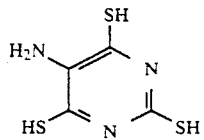
Compound No. 14

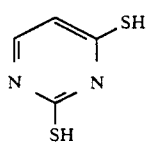
Compound No. 15

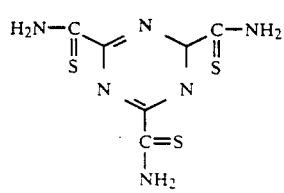
Compound No. 16

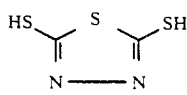
Compound No. 17

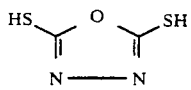
Compound No. 18

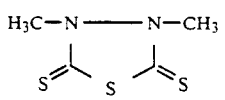
Compound No. 19

Japanese Patent Kokoku No. 48-29723 discloses to improve ink receptivity and printing endurance by allowing organic compounds having mercapto group or thion group to act on transferred silver image. Further, Japanese Patent Kokai No. 58-127928 teaches that 2,4-dimercapto-6-substituted 1,3,5-triazine compound as shown by the above formula (I) can improve printing endurance more effectively than organic compounds having one mercapto group.

However, the conventional processes improve printing endurance at best about 2 times the printing endurance of blank or comparative samples while the process of the present invention can attain improvement of printing endurance more than 10 times and is especially superior in formation of fine line images and half-tone images. This is a surprising effect unexpectable from conventional techniques.

The mechanism of the present invention is not clear, but it is considered that a part of silver image or silver salt or silver complex present in the vicinity of the silver image is converted to silver ion and the silver ion reacts with the monocyclic compound mentioned above to form an oleophilic silver of cross-linked structure, which covers the silver image.

The oxidizing agents used in the present invention are those which are disclosed in the abovementioned Japanese Patent Kokai No. 55-98753, namely, those exemplified below.

(1) Secondary metal ions: These are metal ions excluding the primary metal ions, namely, metal ions of the lowest valence. Examples of the secondary metal ions are $Cu^{+2}$, $Au^{+3}$, $Tl^{+3}$, $Cr^{+6}$, $Mn^{+4}$, $Mn^{+7}$, $Ce^{+4}$, $Rh^{+3}$, $Pb^{+4}$, $Pd^{+2}$, $Pd^{+4}$, $Co^{+3}$, $Ir^{+3}$, $Fe^{+3}$, $Ni^{+3}$, $Sn^{+4}$, $V^{+4}$, $Bi^{+3}$, $Mo^{+3}$, $Mo^{+5}$, $Pt^{+4}$, $Ru^{+4}$, $Te^{+4}$ and $W^{+4}$. These metal ions can be used in the form of water-soluble halogen salt, nitrate, and in case of water-insoluble or sparingly water-soluble salts, there may be used water-miscible organic solvents, for example, alcohols such as methanol, ethanol and isopropanol, dimethylformamide, dioxane and acetone. Water-immiscible organic solvents may also be used.

(2) Halogens: Chlorine, bromine, iodine.

(3) Halogenic acids: Hypohalogenic acids such as potassium hypochlorite, sodium hypoiodite and sodium hypobromite; halogenic acid salts such as sodium chlorate, potassium iodate and sodium bromate; perhalogenic acids such as orthoperiodic acid ($H_5IO_6$) and sodium metaperiodate ($NaIO_4$); N-halocarboxylic acid amides such as N-bromoacetamide, N-bromosuccinimide; N-halosulfonamides such as N-chloro-p-toluenesulfonamide (chloramine T) and N-chlorobenzenesulfonamide (chloramine B); hypohalogenic acid esters such as t-butyl hypochlorite. These may also be used as an aqueous solution or a solution in water-miscible organic solvent or water-immiscible solvent.

(4) Quinones: p-Benzoquinone.

Especially preferred are secondary metal ions such as $Cu^{+2}$ (e.g. cupric chloride and copper nitrate), $Au^{+3}$ (e.g., chloroauric acid), $Tl^{+3}$ (e.g., thallium (III) nitrate), $Fe^{+3}$ (e.g., ferric chloride, ferric sulfate and ferric ethylenediaminetetraacetate), $Co^{+3}$ (e.g., cobalt (III) complex as mentioned in Japanese Patent Kokai No. 48-9729), $Pd^{+2}$ (e.g., palladium chloride), $Ni^{+3}$, $Ce^{+4}$ and $Ir^{+3}$.

In the present invention, it is necessary that aforementioned two compounds are allowed to exist so that they contact with silver image formed for receiving ink.

These two compounds can be contained separately or together in photographic processing solutions such as stop solution, neutralizing solution and fixing solution or various processing solutions used in printing stage such as etch solution and damping solution or special processing solutions may be prepared for application of these two compounds.

Amount of the monocyclic compound to be contained in these processing solutions is suitably about 0.01% to about 5% in practical use.

Amount of the oxidizing agent to be contained in the above processing solutions is preferably from about 1% to saturation concentration of the oxidizing agent, more preferably at least about 3% in practical use.

The silver halide emulsion for use in the light-sensitive material for lithographic printing plate may be silver chloride, silver bromide, silver chlorobromide, silver chloroiodide, silver chlorobromoiodide, etc and preferred are silver halides containing at least 50 mol% of silver chloride. Average grain size of these silver halides is preferably 0.2-0.8 micron, though other grain sizes are usable. The emulsion is preferably monodispersion of silver halide grains, 90% or more of total grains having a size within ±30% of the average size. The grains are preferably in the form of substantially cube or fourteen faced polyhedron, though those having other crystal habits can also be used.

The binder used in the silver halide emulsion in the light-sensitive material for lithographic printing plate of the present invention is usually gelatin which can be partially replaced with one or more hydrophilic polymer binders such as starch, albumin, sodium alginate, hydroxyethyl cellulose, gum arabic, polyvinyl alcohol, polyvinyl pyrrolidone, carboxymethyl cellulose, polyacrylamide, styrene-maleic anhydride copolymer, and polyvinylmethyl ether-maleic anhydride copolymer. An aqueous dispersion (latex) of vinyl The silver halide emulsion can be sensitized by various methods during its preparation or coating. The emulsion is preferably sensitized chemically by the methods well known to the art by using, for example, sodium thiosulfate, alkylthioureas, or gold compounds such as gold rhodanide and gold chloride or mixtures thereof.

Furthermore, the characteristics such as high sensitivity, high sharpness and high resolving power which are especially desired for the materials for direct plate making can be obtained by using at any time during preparation of silver halide emulsion compounds of metals of Group VIII of the periodic table, such as salts of cobalt, nickel, rhodium, palladium, iridium, and platinum. Addition amount of these compounds is in the range of $10^{-8} - 10^{-3}$ mol for one mol of silver halide. The silver halide emulsion layer may contain other ordinary additives such as coating aids, hardeners, antifoggants, matting agents (water-holding agents), and developing agents.

Underneath the silver halide emulsion layer, (i.e., between the support and the emulsion layer), there may be provided a subbing layer to improve adhesion or undercoating layer which may contain a colorant such as carbon black or a light absorbing compound and which may also contain a developing agent or matting agent.

Making of lithographic printing plate from the light-sensitive material according to the present invention is especially preferably performed by silver complex diffusion transfer process (DTR process).

The light-sensitive material to which the DTR process is applied has an image receiving layer containing physical development nuclei. This image receiving layer can be provided underneath the silver halide emulsion layer. In this case, the material is imagewise exposed and DTR developed and thereafter the silver halide emulsion layer is removed to make a lithographic printing plate. Especially preferably, the image receiving layer is provided over the silver halide emulsion layer, namely, as an outermost surface layer.

As the physical development nuclei, there may be used known ones, for example, metals such as antimony, bismuth, cadmium, cobalt, palladium, nickel, silver, lead and zinc and sulfides thereof. The image receiving layer may contain one or more hydrophilic colloids such as gelatin, carboxymethyl cellulose, gum arabic, sodium alginate, hydroxyethyl starch, dialdehyde starch, dextrin, hydroxyethyl cellulose, polystyrenesulfonic acid, vinylimidazole-acrylamide copolymer and polyvinyl alcohol. In the case of lithographic printing plate having the image receiving layer as a surface layer, amount of the hydrophilic colloid (binder) contained in the image receiving layer is preferably 0.5 g/m² or less.

The image receiving layer may contain hygroscopic substances or wetting agents such as sorbitol and glycerol. The image receiving layer may further contain pigments for scumming prevention such as barium sulfate, titanium dioxide, China clay and silver. developing agents such as hydroquinone and hardeners such as formaldehyde and dichloro-S-triazine.

Supports can be paper; films such as cellulose acetate film, polyvinyl acetal film, polystyrene film, polypropylene film, polyethylene terephthalate film; composite films such as polyester, polypropylene or polystyrene film coated with polyethylene film; metals; metallized paper; or metal/paper laminates. A paper support coated on or both sides with an α olefin polymer such as polyethylene is also useful. These supports may contain an antihalation compound.

Development processing solution used in the present invention may contain alkaline substances such as sodium hydroxide, potassium hydroxide, lithium hydroxide, and trisodium phosphate; preservatives such as sulfites; silver halide solvents such as thiosulfates, thiocyanates, cyclic imides, thiosalicylic acid, and amines; thickening agents such as hydroxyethyl cellulose and carboxymethyl cellulose; antifoggants such as potassium bromide, 1-phenyl-5-mercaptotetrazole and compounds mentioned in Japanese Patent Kokai No. 47-26201, developing agents such as hydroquinone and 1-phenyl-3-pyrazolidone and development modifiers such as polyoxyalkylene compounds and onium compounds.

In carrying out silver complex diffusion transfer process, a developing agent can be contained in silver halide emulsion layer and/or image receiving layer or other water-permeable layers contiguous to the image receiving layer as disclosed in British Patent Nos. 1,000,115, 1,012,476, 1,017.273 and 1,042,477. Therefore, in case of such materials, the processing solution used in development can be a so-called "alkaline activating solution" containing no developing agent.

Compositions of neutralizing solution, fixing solution, grease-desensitizing solution, etch solution and damping solution depend on purpose and kind of plate materials as well known for one skilled in the art. These solutions are preferably modified in their processing activity by incorporating therein the abovementioned mercapto organic compounds, grease-desensitizing accelerators, buffers, preservatives, and wetting agents which have been known to the art. For example, plate making processing solutions and printing processing solutions which completely satisfy the object of the present invention can be obtained by addition of one or more of gum arabic, carboxymethyl cellulose, sodium alginate, vinylpyrrolidone, vinylimidazole, methylvinyl ether-maleic anhydride copolymer, carboxymethyl starch, ammonium alginate, alginic acid oxidized cellulose, methylcellulose, sulfates (e.g., sodium sulfate and ammonium sulfate), sulfites (e.g., potassium sulfite and sodium sulfite), phosphoric acid, nitric acid, nitrous acid, tannic acid and salts thereof, polyol compounds having at least 2 hydroxy groups (e.g., polyethylene glycol, propylene glycol, pentaerythritol, glycerol, diethylene glycol, and hexylene glycol), organic weak acids (e.g., citric acid, succinic acid, tartaric acid, adipic acid, ascorbic acid, and propionic acid), inorganic fine particles (e.g., colloidal silica and alumina), polyacrylic acid, ammonium bichromate, chrome alum, alginic acid propylene glycol ester, aminopolycarboxylates (e.g., sodium ethylenediaminetetraacetate), and surface active agents.

Besides, there may also be added a slight amount of water-miscible organic solvents such as methanol, dimethylformamide and dioxane and colorants considering especially discremination of solutions and appearance of solutions such as phthalocyanine dyes, Malachite Green and ultramarine.

The following nonlimiting examples explain the present invention in more detail.

EXAMPLE 1

On one side of a subbed polyester film support was provided a matting layer containing silica particles of 5μ in average particle size. On the opposite side was provided an antihalation undercoat layer (adjusted to pH 4.0) containing carbon black in an amount to give a reflectance of 3% for light of 633 nm and 20% by weight, based on photographic gelatin, of silica powder of 7 μm in average particle size. Onto the undercoat layer was then applied a high sensitivity silver chloride emulsion layer (adjusted to pH 4.0) containing 5% by weight, based on photographic gelatin, of silica powder of 7 μm in average particle size which was chemically sensitized and then spectrally sensitized.

Amount of gelatin in the undercoat layer was 3.5 g/m$^2$, that of gelatin in the emulsion layer was 0.8 g/m$^2$ and that of silver halide in terms of silver nitrate was 1.0 g/m$^2$. These undercoat layer and the emulsion layer contained formalin as a hardener in an amount of 5.0 mg/g gelatin. After drying, the coated support was heated at 40° C. for 14 days and then on the emulsion layer was coated a nuclei coating composition used for plate No. 31 in Example 2 of Japanese Patent Kokai No. 54-103104 and dried to make a light-sensitive material for lithographic printing plate. The silver halide emulsion contained $4 \times 10^{-3}$ mol of rhodium chloride per 1 mol of silver halide, which had been added during physical ripening and had an average grain size of 0.40 micron.

The resulting light-sensitive material for lithographic printing plate was subjected to imagewise exposure by a press camera having reversal mechanism and to development with the following developer (actually used solution) at 30° C. for 30 seconds and then was treated with the following neutralizing solution.

| [Developer] | |
| --- | --- |
| Sodium hydroxide | 24 g |
| Potassium hydroxide | 8 g |
| Anhydrous sodium sulfite | 50 g |
| 3-Mercapto-4-acetamide-5-n-heptyl-1,2,4-triazole | 0.15 g |
| 2-Mercaptobenzoic acid | 0.1 g |
| 2-Methyl-2-amino-1-propanol | 30 g |
| Water to make up 1 liter. | |
| [Neutralizing solution] | |
| Ethylene glycol | 5 g |
| Colloidal silica (20% aqueous solution) | 1 g |
| Anhydrous sodium sulfite | 10 g |
| Disodium hydrogen phosphate (12 hydrate) | 35 g |
| Water to make up 1 liter. (adjusted to pH 7.8) | |

The thus obtained printing plate was mounted of an offset printing plate and applied with the following etch solution all over the plate surface and printing was run using the following damping solution:

| [Etch solution] | |
| --- | --- |
| Water | 600 ml |
| Isopropanol | 400 ml |
| Ethylene glycol | 50 g |
| 3-Mercapto-4-acetamido-5-n-butyl-1,2,4-triazol | 1 g |
| [Damping solution] (Actually used solution was one diluted 10 times with water) | |
| Water | 300 ml |
| Succinic acid | 6 g |

-continued

| | |
|---|---|
| Sodium sulfate | 25 g |
| Ethylene glycol | 100 g |
| Colloidal silica (20% aqueous solution) (adjusted to pH 5.5) | 28 g |

The printing machine used was A. B. Dick 350CD (trademark for offset printing machine manufacture by A. B. Dick Co.). Ink receptivity, degree of stain and printing endurance were determined by the following methods.

(1) Ink receptivity:
Simultaneously with contacting a roller applied with an ink with the plate surface, feeding of paper was started and the ink receptivity was evaluated in terms of the number of copies before satisfactory image density began to be obtained.

(2) Evaluation of stain:
Printing of 10,000 copies was carried out and degree of stain was evaluated in the following three grades.
O: No stain occurred.
Δ: Partial or light stain occurred.
X: Light stain occurred all over the surface.

(3) Printing endurance:
Printing endurance was evaluated in terms of the number of copies delivered before disappearance of ink in silver image portions occurred when printing of 1,000–50,000 copies was affected and expressed in the following 5 grades.
1: Less than 2,000 copies
2: Less than 5,000 copies
3: Less than 25,000 copies
4: Less than 50,000 copies
5: More than 50,000 copies Making of printing plates and printing were carried out in the same manner as above except that the neutralizing solution additionally contained 5% by weight of ferric ethylenediaminetetraacetate and 0.5% by weight of a mercapto compound as shown in Table 1.
The results are shown in Table 1 together.

TABLE 1

| No. | Neutralizing solution | | Ink receptivity | Stain | Printing endurance |
|---|---|---|---|---|---|
| | Oxidizing agent | Organic compound | | | |
| 1 | — | — | 30 | 0 | 1 |
| 2 | Present | Comparative (a) | 20 | 0 | 2 |
| 3 | Present | Comparative (b) | 20 | 0 | 2 |
| 4 | — | Comparative (c) | 20 | 0 | 1 |
| 5 | Present | Comparative (c) | 20 | 0 | 2 |
| 6 | — | Compound No. 2 | 20 | 0 | 2 |
| 7 | Present | Compound No. 2 | 5 | 0 | 5 |
| 8 | — | Compound No. 6 | 20 | 0 | 2 |
| 9 | Present | Compound No. 6 | 5 | 0 | 5 |
| 10 | — | Compound No. 10 | 25 | 0 | 2 |
| 11 | Present | Compound No. 10 | 5 | 0 | 4 |

Comparative (a): 2,3-dimercaptosuccinic acid
Comparative (b): 3-Mercapto-4-acetamido-n-butyl-1,2,4-triazole
Comparative (c):

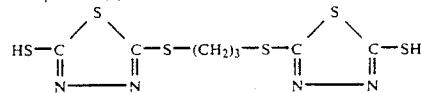

From the results, it can be seen that according to the process of the present invention which used the neutralizing solution Nos. 7, 9 and 11, printing endurance can be sharply improved over the printing endurance level of the conventional silver salt printing plates.

EXAMPLE 2

Printing plates made using the neutralizing solutions used in Example 1 which contained or did not contain the oxidizing agent and which contained Compound Nos. 1, 5, 12, 14 and 15 exemplified hereinbefore were tested in the same manner as in Example 1 to obtain the similar results.

EXAMPLE 3

Making of printing plates and printing were carried out in the same manner as in Example 1 except that the etch solution additionally contained ferric ethylenediaminetetraacetate (3% by weight) and Compound No. 2, 6, 10, 14, 15 or 17 (1% by weight) in combination or the etch solution additionally contained only the compound No. 2, 6, 10, 14, 15 or 17 and did not contain the ferric ethylenediaminetetraacetate. When the comparative etch solutions were used, printing endurance was the level of 2 while when the etch solutions according to the present invention were used, the printing endurance was in the level of 4–5. Thus, it was confirmed that the process of the present invention is markedly superior process as in Example 1.

It was also confirmed that cupric chloride, potassium permanganate, p-benzoquinone, etc. as the oxidizing agents which are disclosed in Japanese Patent Kokai No. 55-98753 were similarly effective.

According to the present invention, ink receptivity and especially printing endurance of lithographic printing plates utilizing silver image as ink receptive area can be markedly improved as compared with conventional processes.

What is claimed is:
1. A process for making a lithographic printing plate utilizing silver image as ink receptive area which comprises subjecting a light-sensitive material for lithographic printing plate to imagewise exposure and development and then treating the whole resulting silver image with an oxidizing agent and a monocyclic compound comprising a nitrogen-containing single ring and having substituents on at least two atoms constituting said ring, said substituents being capable of reacting with silver ion wherein the monocyclic compound is represented by the formula I:

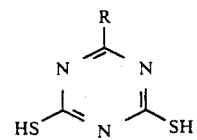

wherein R is selected from hydrogen, an alkyl group, —OR',

or a mercapto group; wherein R', R$^2$, and R$^3$ are selected from hydrogen, an alkyl group, an aryl group, an aralkyl or an alkenyl group.

2. A process according to claim 1 wherein the oxidizing agent and the monocyclic compound are contained separately or together in a stop solution, a fixing solution, a neutralizing solution, and etch solution or damping solution.

3. A process according to claim 1 wherein the monocyclic compound is contained in a concentration of about 0.01% to about 5% in the solution.

4. A process according to claim 1 wherein the oxidizing agent is contained in a concentration of about 1% to saturation concentration in the solution.

5. A process according to claim 1 wherein the light-sensitive material comprises a support and at least a silver halide emulsion layer and an image receiving layer containing physical development nuclei which are provided on the support.

6. A process according to claim 5 wherein the image receiving layer contains 0.5 g/m$^2$ or less of a binder.

7. A method using the lithographic printing plate made according to the process of claim 1.

8. A method of printing according to claim 7 using an etch solution containing the oxidizing agent and the monocyclic compound defined in claim 1.

9. A method of printing according to claim 7 using a damping solution containing the oxidizing agent and the monocyclic compound defined in claim 1.

* * * * *